United States Patent [19]
Goodwin et al.

[11] Patent Number: 5,997,588
[45] Date of Patent: Dec. 7, 1999

[54] SEMICONDUCTOR PROCESSING SYSTEM WITH GAS CURTAIN

[75] Inventors: Dennis L. Goodwin, Chandler; Mark R. Hawkins, Gilbert; Richard Crabb, Mesa; Allan D. Doley, Phoenix, all of Ariz.

[73] Assignee: Advanced Semiconductor Materials America, Inc., Phoenix, Ariz.

[21] Appl. No.: 08/729,550

[22] Filed: Oct. 11, 1996

Related U.S. Application Data

[60] Provisional application No. 60/005,413, Oct. 13, 1995, abandoned.

[51] Int. Cl.$^6$ ............................. H01L 21/68; B65G 49/07
[52] U.S. Cl. ...................... 29/25.01; 414/805; 414/939; 414/941; 438/941; 438/908
[58] Field of Search .................... 29/25.01; 414/805, 414/939, 941; 438/941, 908

[56] References Cited

U.S. PATENT DOCUMENTS

| | | |
|---|---|---|
| 3,314,393 | 4/1967 | Haneta . |
| 3,635,757 | 1/1972 | Harris . |
| 3,659,551 | 5/1972 | McKinstry . |
| 3,660,179 | 5/1972 | Desmond et al. . |
| 3,672,948 | 6/1972 | Foehring et al. . |
| 3,696,779 | 10/1972 | Murai et al. . |
| 3,785,853 | 1/1974 | Kirkman et al. . |
| 3,893,876 | 7/1975 | Akai et al. . |
| 3,925,118 | 12/1975 | Hollan . |
| 4,048,955 | 9/1977 | Anderson . |
| 4,116,733 | 9/1978 | Olsen et al. . |
| 4,438,723 | 3/1984 | Cannella et al. . |
| 4,438,724 | 3/1984 | Doehler et al. . |
| 4,450,786 | 5/1984 | Doehler et al. . |
| 4,459,104 | 7/1984 | Wollmann . |
| 4,480,585 | 11/1984 | Gattuso . |
| 4,500,407 | 2/1985 | Boys et al. . |
| 4,537,795 | 8/1985 | Nath et al. . |
| 4,543,059 | 9/1985 | Whang et al. . |
| 4,682,565 | 7/1987 | Carrico . |
| 4,803,948 | 2/1989 | Nakagawa et al. . |
| 4,821,674 | 4/1989 | Deboer . |
| 4,823,480 | 4/1989 | Komatsuzaki . |
| 4,824,309 | 4/1989 | Kakehi et al. . |
| 4,836,138 | 6/1989 | Robinson . |
| 4,949,669 | 8/1990 | Ishii et al. . |
| 4,950,156 | 8/1990 | Philipossian . |
| 5,064,367 | 11/1991 | Philipossian . |
| 5,080,549 | 1/1992 | Goodwin . |

(List continued on next page.)

FOREIGN PATENT DOCUMENTS 2-045920  2/1990  Japan .

*Primary Examiner*—David Graybill
*Attorney, Agent, or Firm*—Knobbe, Martens, Olson & Bear LLP

[57] ABSTRACT

A gas curtain for use with a semiconductor processing system to prevent unwanted gases from entering a processing chamber. The gas curtain includes both upward and downward flows of gas surrounding an isolation valve adjacent a delivery port into the processing chamber. In the valve open position, the downward flows extends between the valve and the delivery port, and the upward flow extends in an opposite direction behind the isolation valve. In the valve closed position, one of the flows extends through a slot in the isolation valve, while the other flow is directed in an opposite direction on the rear side of the isolation valve. In a method of using the gas curtain apparatus, a pick-up wand operating on a Bernoulli principal uses gases which are unwanted in the processing chamber, and just prior to loading wafers into the processing chamber, the gas flow in the Bernoulli wand is switched from a first gas to a second gas. Desirably, the second gas is hydrogen. The Bernoulli wand passes through the gas curtain before entering the processing chamber to remove any fugitive particles, moisture and unwanted gases. An exhaust located proximate to an input/output chamber creates a continuous pressure gradient in the handling chamber toward the input/output chamber further helping to prevent unwanted gases from entering the processing chamber.

40 Claims, 13 Drawing Sheets

U.S. PATENT DOCUMENTS

| | | |
|---|---|---|
| 5,105,762 | 4/1992 | Wilkinson . |
| 5,147,168 | 9/1992 | Suwa et al. . |
| 5,156,521 | 10/1992 | Crabb . |
| 5,259,883 | 11/1993 | Yamabe et al. . |
| 5,266,116 | 11/1993 | Fujioka et al. . |
| 5,312,490 | 5/1994 | Wilkinson . |
| 5,316,794 | 5/1994 | Carlson et al. . |
| 5,344,542 | 9/1994 | Maher et al. . |
| 5,352,293 | 10/1994 | Yang et al. . |
| 5,363,872 | 11/1994 | Lorimer . |
| 5,370,736 | 12/1994 | Roy et al. . |
| 5,374,313 | 12/1994 | Doehler . |
| 5,382,127 | 1/1995 | Garric et al. . |
| 5,388,944 | 2/1995 | Takanabe et al. . |
| 5,388,945 | 2/1995 | Garric et al. . |
| 5,390,785 | 2/1995 | Garric et al. . |
| 5,411,358 | 5/1995 | Garric et al. . |
| 5,411,593 | 5/1995 | Carlson et al. . |
| 5,425,812 | 6/1995 | Tsutahara et al. . |

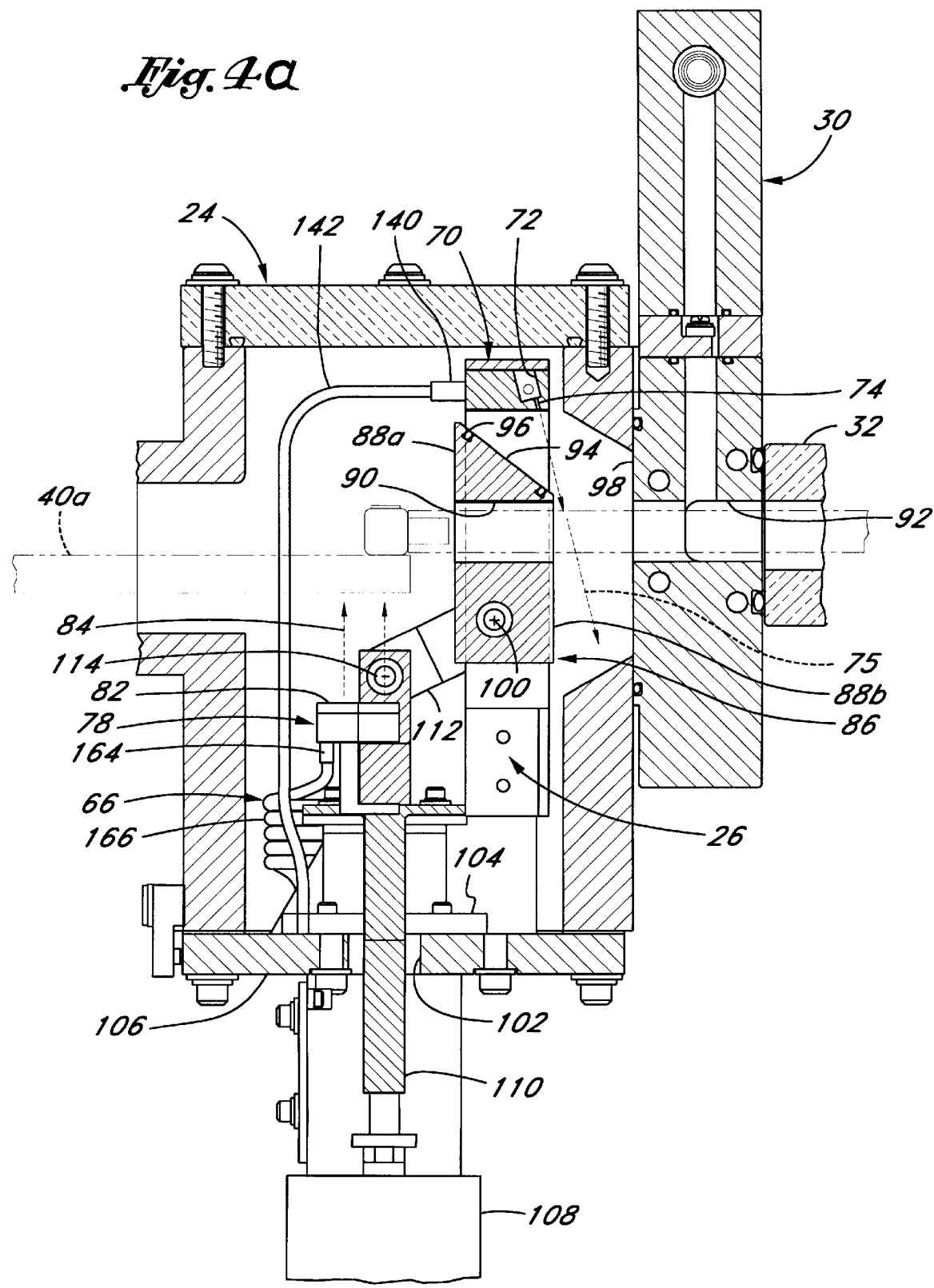

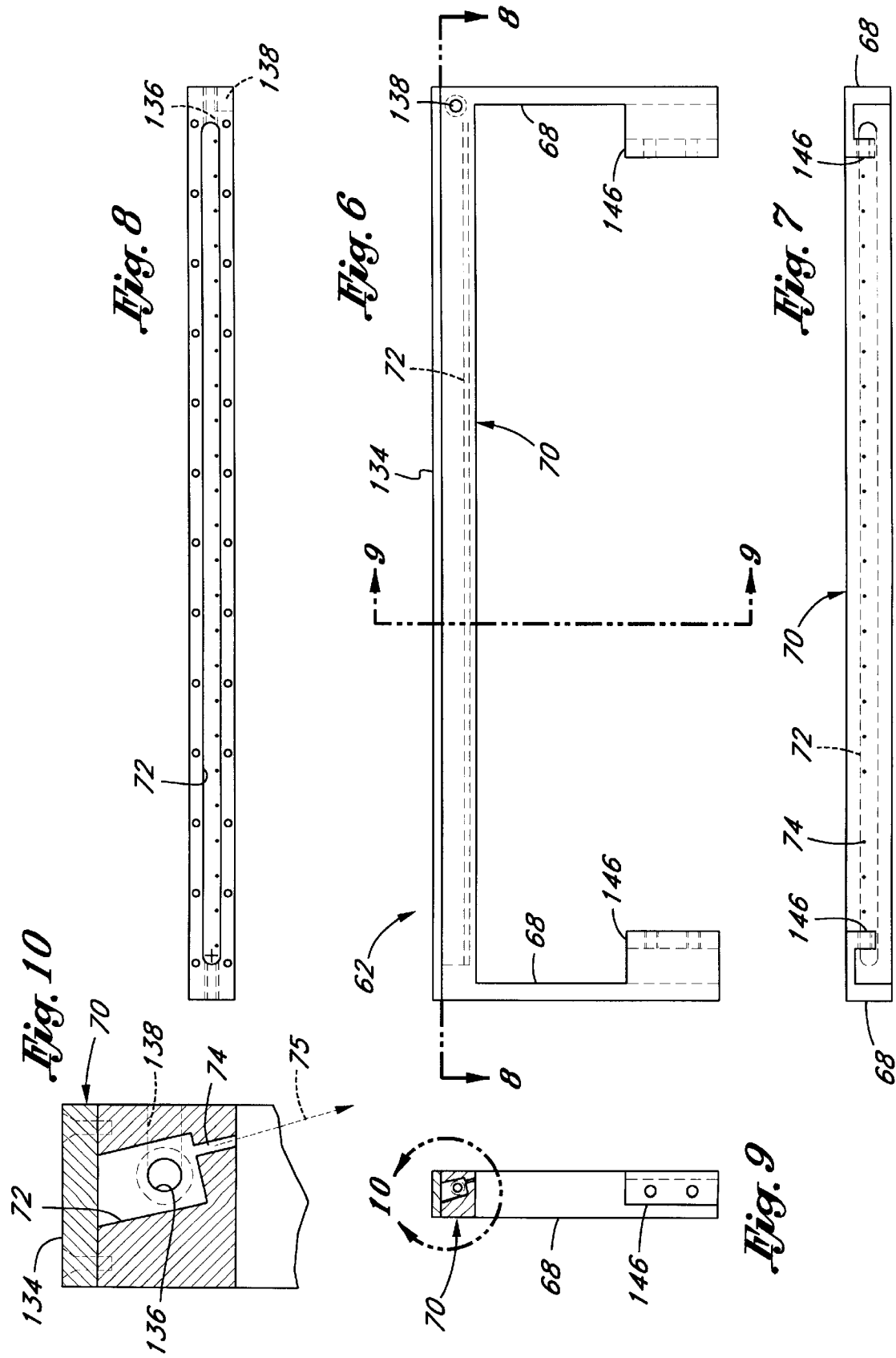

| SEQ. | PICKUP WAFER | TRANSPORT WAFER | OPEN GATE VALVE | LOAD WAFER | CLOSE GATE VALVE | PROCESS | OPEN GATE VALVE | UNLOAD WAFER | CLOSE GATE VALVE | PREPARE CHAMBER |
|---|---|---|---|---|---|---|---|---|---|---|
| 1. | | $N_2H_2$ | | | $H_2N_2$ | | | | | |
| 2. | $H_2$ | | | | $H_2N_2$ | | | | | $N_2$ |
| 3. | $H_2$ | $N_2H_2$ | | | | | | | $H_2N_2$ | |
| 4. | $H_2$ | | | | | | | | $H_2N_2$ | $N_2$ |
| 5. | $H_2$ | | | | $H_2N_2$ | $N_2H_2$ | | | | |
| 6. | | | | | | | | | | |

*Fig. 17*

SEMICONDUCTOR PROCESSING SYSTEM WITH GAS CURTAIN

RELATED APPLICATION

Pursuant to 35 U.S.C. § 119(e), this application claims the priority benefit of provisional Application No. 60/005,413, filed Oct. 13, 1995, now abandoned.

FIELD OF THE INVENTION

This invention relates to processing systems for chemical vapor deposition or other processing of semiconductor wafers and the like. More particularly, the invention relates to an apparatus and method for excluding an unwanted material from a reaction chamber of a processing system.

BACKGROUND OF THE INVENTION

High-temperature ovens, called reactors, are used to process semiconductor wafers from which integrated circuits are made for the electronics industry. A circular wafer or substrate, typically made of silicon, is placed on a wafer support called a susceptor. Both the wafer and susceptor are enclosed in a quartz chamber and heated to 600° C. (1112° F.) or higher, typically by a plurality of radiant lamps placed around the quartz chamber. A reactant gas is passed over the heated wafer, causing the chemical vapor deposition (CVD) of a thin layer of the reactant material on the wafer. Through subsequent processes in other equipment, these layers are made into integrated circuits, with a single layer producing from tens to thousands of integrated circuits, depending on the size of the wafer and the complexity of the circuits.

If the deposited layer has the same crystallographic structure as the underlying silicon wafer, it is called an epitaxial layer. This is also sometimes called a monocrystalline layer because it has only one crystal structure.

In recent years, single-wafer processing of larger diameter wafers has grown for a variety of reasons including its greater precision as opposed to processing batches of wafers at the same time. Although single-wafer processing by itself provides advantages over batch processing, control of the process parameters remains critical and is perhaps more so because of the increased cost of the larger wafers. One especially important element is the reduction of particulate matter within the reaction chamber which might contaminate the purity of the resulting semiconductor wafers.

Another problem in wafer manufacturing is the contamination of the reaction chamber with water molecules. That is, some small concentration of airborne water particles inevitably migrates into the reaction chamber along with the wafer. This is because the wafers are initially loaded from an external location, and is very difficult to purge completely the moisture in the air. Indeed, some small number of water molecules may adhere to the surface of each wafer. Water in the reaction chamber can create nonuniformities in the subsequently deposited chemical layers.

In many continuous processing systems, as well as multi-chamber systems, the wafers are loaded through an input port and then passed through one or more intermediate chambers before entering the reaction chamber. One such multiple chamber system is disclosed in U.S. Pat. No. 5,156,521, issued to Crabb, et al. In the Crabb device, a magazine of wafers is placed within an input chamber through a door. The door is then closed, and the chamber is purged with nitrogen. An elevator lowers the magazine through an aperture in the floor of the input chamber and into registration with an entry port into a handling chamber. A robot arm having a pick-up wand on one end then removes wafers from the magazine and transfers them to one of the reaction chambers surrounding the handling chamber. Isolation valves are provided between the handling chamber and the various reaction chambers. The environment within the handling chamber is thus sealed from that within the reaction chambers. Furthermore, the pick-up wand operates on a Bernoulli principal in that gas flows downward from the pick-up wand to lift the individual wafers by creating a reduced pressure on top of the wafers due to the gas velocity over the top surface.

Because many thermal CVD processes involve extremely high temperatures within the reaction chamber to catalyze the chemical deposition process, the throughput of the system is slowed as the hot wafers are removed from the reactor and deposited in a waiting unload magazine, for example. Bernoulli wands are beneficial in this respect because they need not directly contact the wafers, and thus can lift them when they are hot. There have been a number of attempts to design secondary cooling chambers within which the wafers are placed to cool rapidly and speed the throughput of the system. However, the separate chambers add expense to the system.

Currently, there is a need for a processing system which more effectively prevents unwanted gases from entering the reaction chamber.

BRIEF DESCRIPTION OF THE DRAWINGS

FIG. 4a is a cross-sectional view taken along line 4—4 of FIG. 2 of the gas curtain apparatus of the present invention adjacent the isolation valve in an open position;

FIG. 6 is an elevational view of an upper gas manifold of the gas curtain apparatus;

FIG. 7 is a bottom plan view of the upper manifold;

FIG. 8 is a top plan view of the upper gas manifold with a top cover removed, taken along line 8—8 of FIG. 6;

FIG. 9 is a partial cross-sectional view through the upper manifold taken along line 9—9 of FIG. 6;

FIG. 10 is an enlarged detail of the encircled area of the upper manifold in FIG. 9;

Figure 18A:
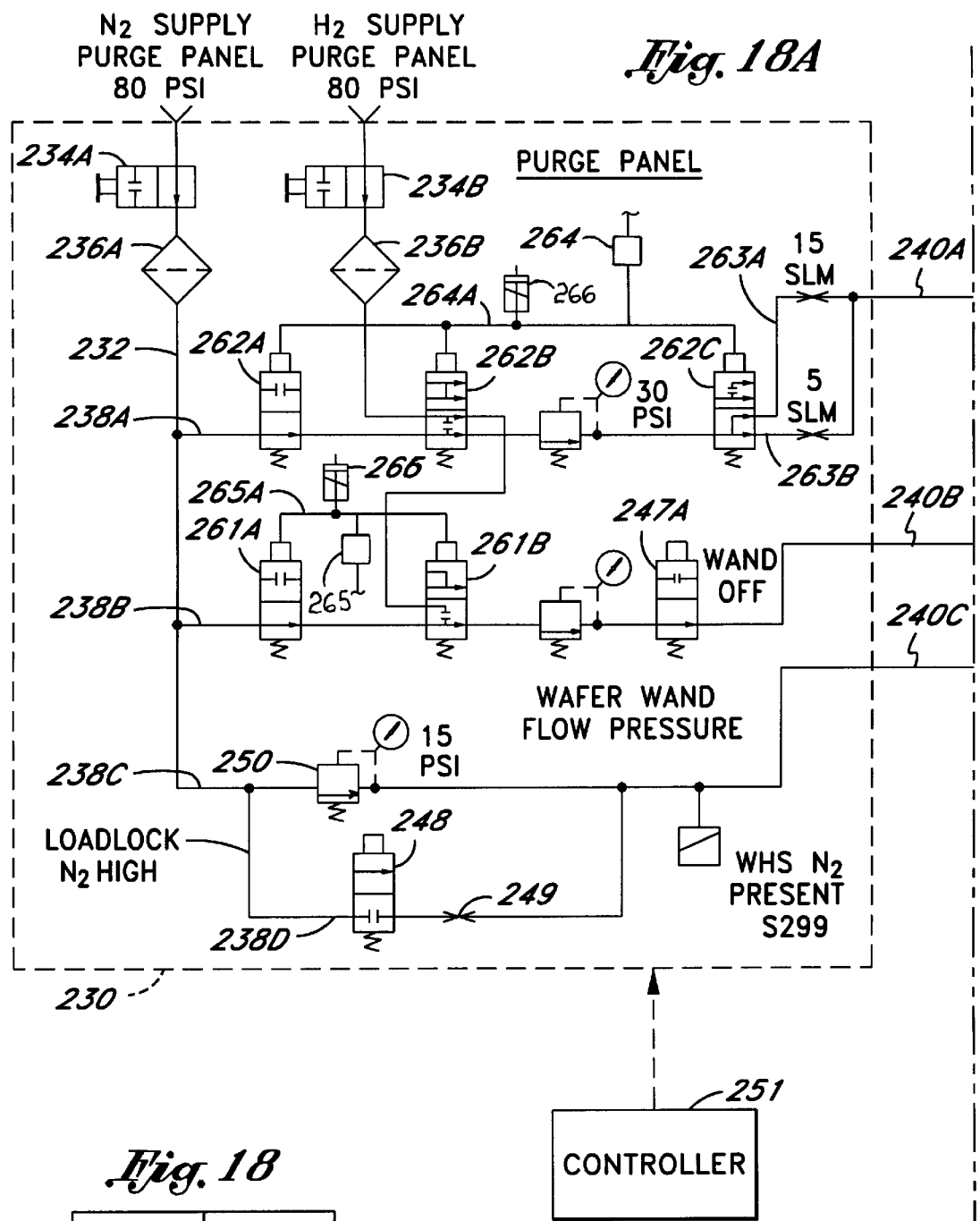
Figure 18:
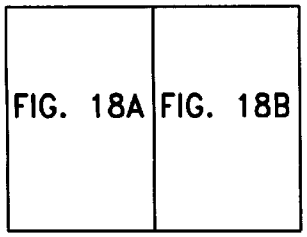

FIG. 17 is a table showing the various gas flows through a typical CVD process cycle; and FIG. 18, comprising subfigures 18A and 18B, is a schematic diagram of a gas flow valve control system for use in the present invention.

DESCRIPTION OF THE PREFERRED EMBODIMENTS

System

Figure 1:
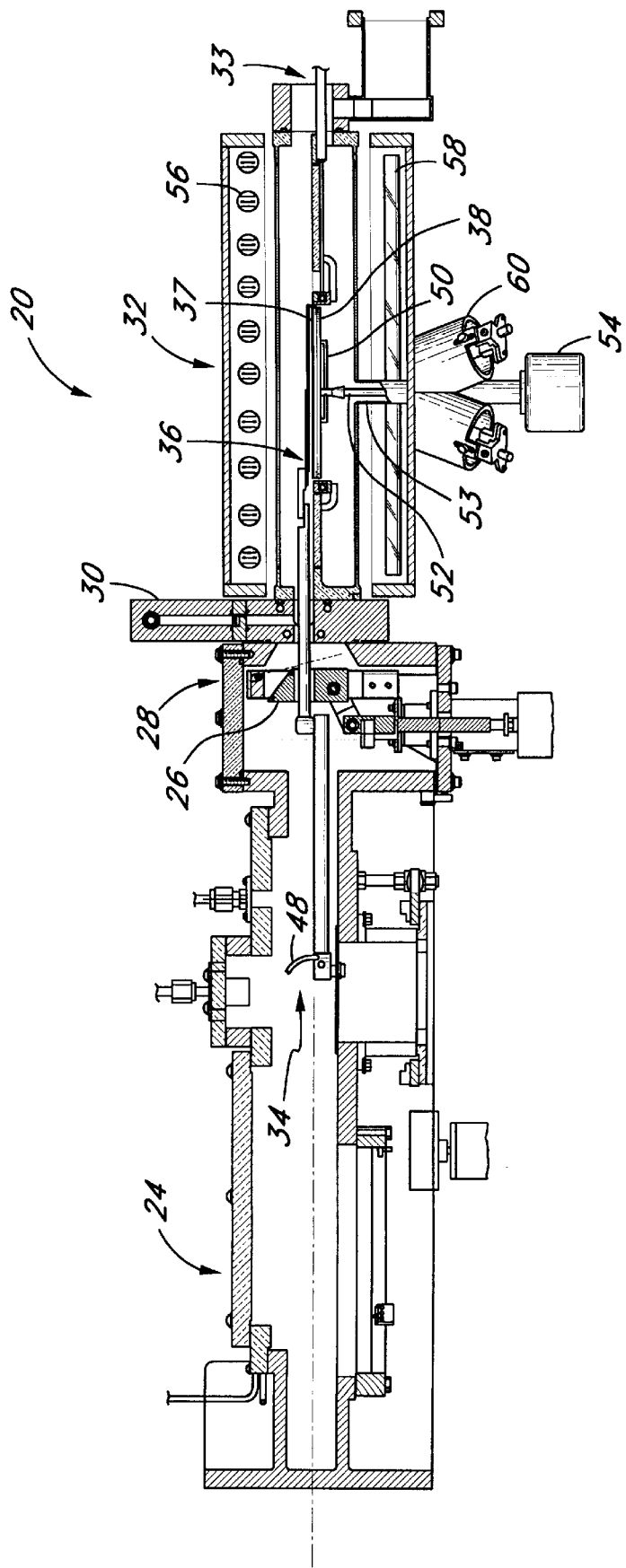
FIG. 1 is a cross-sectional view of a portion of a semiconductor processing system utilizing a gas curtain of the present invention.
Figure 2:
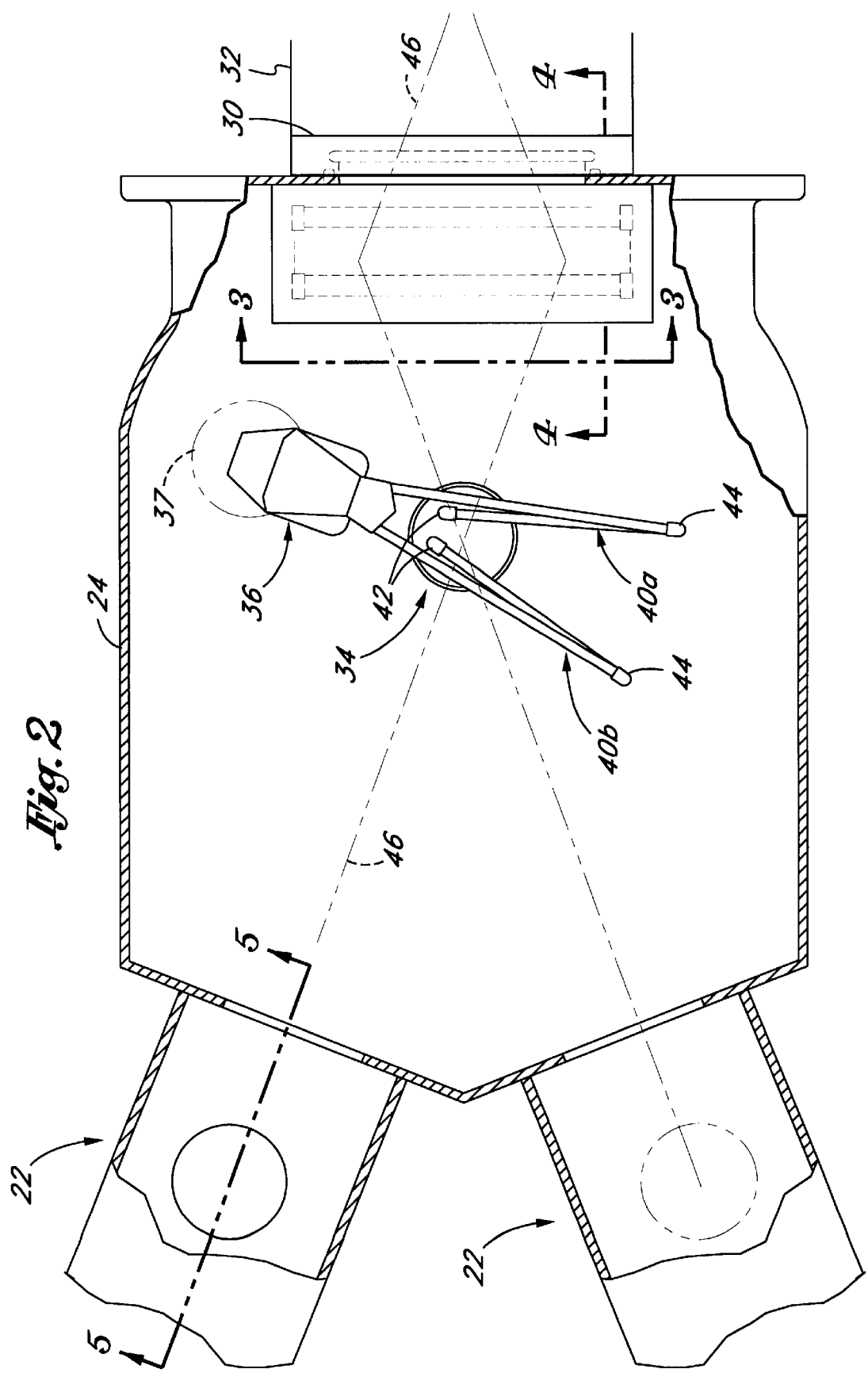
FIG. 2 is a top plan view of the interior of a handling chamber showing the gas curtain of the present invention adjacent a reaction chamber delivery port.

FIGS. 1 and 2 illustrate the primary components of a chemical vapor deposition processing system 20 utilizing a gas curtain apparatus of the present invention. From left to right, the processing system 20 generally comprises one or more load locks or input/output chambers 22 (FIG. 2), a handling chamber 24, an isolation valve 26 having a gas curtain apparatus 28 there around, a gas injector 30, and a reaction chamber 32 having an exhaust system 33. For orientation purposes, in the horizontal plane, a longitudinal direction is defined extending from the input/output chambers 22 to the reaction chamber 32, with a lateral direction perpendicular thereto.

Processing Sequence

In a conventional processing sequence, wafers are introduced into the system through the input/output chambers 22 and are delivered via the handling chamber 24 to the reaction chamber 32 using a handler 34 having a pick-up wand 36. In an open position, the isolation valve 26 allows the pick-up wand 36 to extend into the reaction chamber and place a wafer 37 on a susceptor 38 for processing. The handler 34 then retracts, and the isolation valve 26 closes before processing of the wafer. Gas flows through the reaction chamber 32 from the injector 30 across the wafer 37 to the exhaust system 33. A scrubber (not shown) is typically provided in the exhaust system 33 downstream from the reaction chamber 32 to "scrub" the product gases from the wafer deposition process, the scrubber also generating a vacuum to pull the gases from the reaction chamber. Such scrubbers are known in the art.

Once the wafer is processed, the isolation valve 26 opens once again, and the handler 34 retracts the wafer from the reaction chamber 32 and delivers it to one of the input/output chambers 22. A typical process takes about 4 minutes from lifting the unprocessed wafer to delivering the processed wafer to the output chamber. Although the present invention is described and illustrated with reference to a single reaction chamber 32 coupled to the handling chamber 24, multiple reaction chambers surrounding the handling chamber may be utilized with the gas curtain apparatus of the present invention provided for each.

Wafer Handler

With reference to FIG. 2, the range of motion of the handler 34 within the handling chamber 24 is shown. More particularly, the handler 34 comprises a pair of articulated robot arms 40a, 40b having proximal ends 42 mounted to be rotated about drive shafts of a drive assembly (not shown). Each of the arms 40a,b has an intermediate joint 44, and the pick-up wand 36 is mounted at the distal ends of the arms. Drive shafts of the drive assembly are rotated in opposite directions for extending and retracting the robot arms 40a,b. The specifics of the robot arm are set forth in U.S. Pat. No. 5,080,549, owned by the assignee of the present invention, which is hereby expressly incorporated by reference. Alternatively, other arrangements of robot arms may be utilized.

The pick-up wand 36 operates on a Bernoulli principal to lift the wafers. That is, gas passages are provided through the hollow articulated robot arms 40a,b leading to apertures directed downward from the pick-up wand 36 in a predetermined pattern. The downward flow of gas above the wafers creates a reduced pressure in that region, thus lifting the wafers. As described in U.S. Pat. No. 5,080,549, one particular type of Bernoulli wand preferably utilized in the present invention includes a plurality of gas outlets below a lower plate, most of the outlets being directed outward toward the wafer periphery, and a central outlet directed perpendicular to the lower surface. More of the outwardly directed outlets expel gas in a direction toward a support arm to bias the suspended wafer into contact with positioning pins on the underside of the pick-up wand. While the gas is flowing, therefore, the wafer is held suspended underneath the pick-up wand. The articulated arms 40a,b are sufficiently long to extend within the input/output chambers, and also to extend within the reaction chamber, as indicated by the range of motion lines 46. A gas inlet conduit 48 is shown leading into the proximal end of the handler 34 shown in FIG. 1.

Reaction Chamber

FIG. 1 illustrates a particularly successful arrangement of components surrounding the reaction chamber 32 to produce highly uniform chemical vapor deposition. The susceptor 38 is rotated by arms 50 of a support which is mounted on a shaft 52. The shaft 52 extends downward through a tube 53 and is rotated by a motor 54 disposed below the chamber 32. The rotational coupling between the motor 54 and shaft 52 is explicitly described in U.S. Pat. No. 4,821,674, hereby expressly incorporated by reference. The motor 54 is advantageously mounted on a fixed frame and includes adjustment mechanisms for positioning the susceptor 38 within the chamber 32. More particularly, the susceptor 38 may be vertically positioned with respect to the chamber 32 or may be tilted in various desired configurations.

A plurality of radiant heating lamps are arranged around the reaction chamber 32 to heat the susceptor 38 and wafer thereon. A first upper bank of lamps 56 is shown extending laterally with respect to the gas flow through the chamber 32. A second lower bank of lamps 58 is shown extending longitudinally with respect to the gas flow through the chamber 32. The upper and lower banks of lamps 56, 58 are thus arranged in a crosswise fashion. One or more spotlights or directed lamps 60 are positioned underneath the chamber 32 and surrounding the tube 53. The lamps 60 direct radiant energy to the underside of the susceptor 38, which may be shadowed by the shaft 52 and susceptor supporting structure. The specific heating arrangement is described and illustrated in U.S. Pat. No. 4,836,138, which is hereby expressly incorporated by reference.

Gas Curtain

Figure 3:
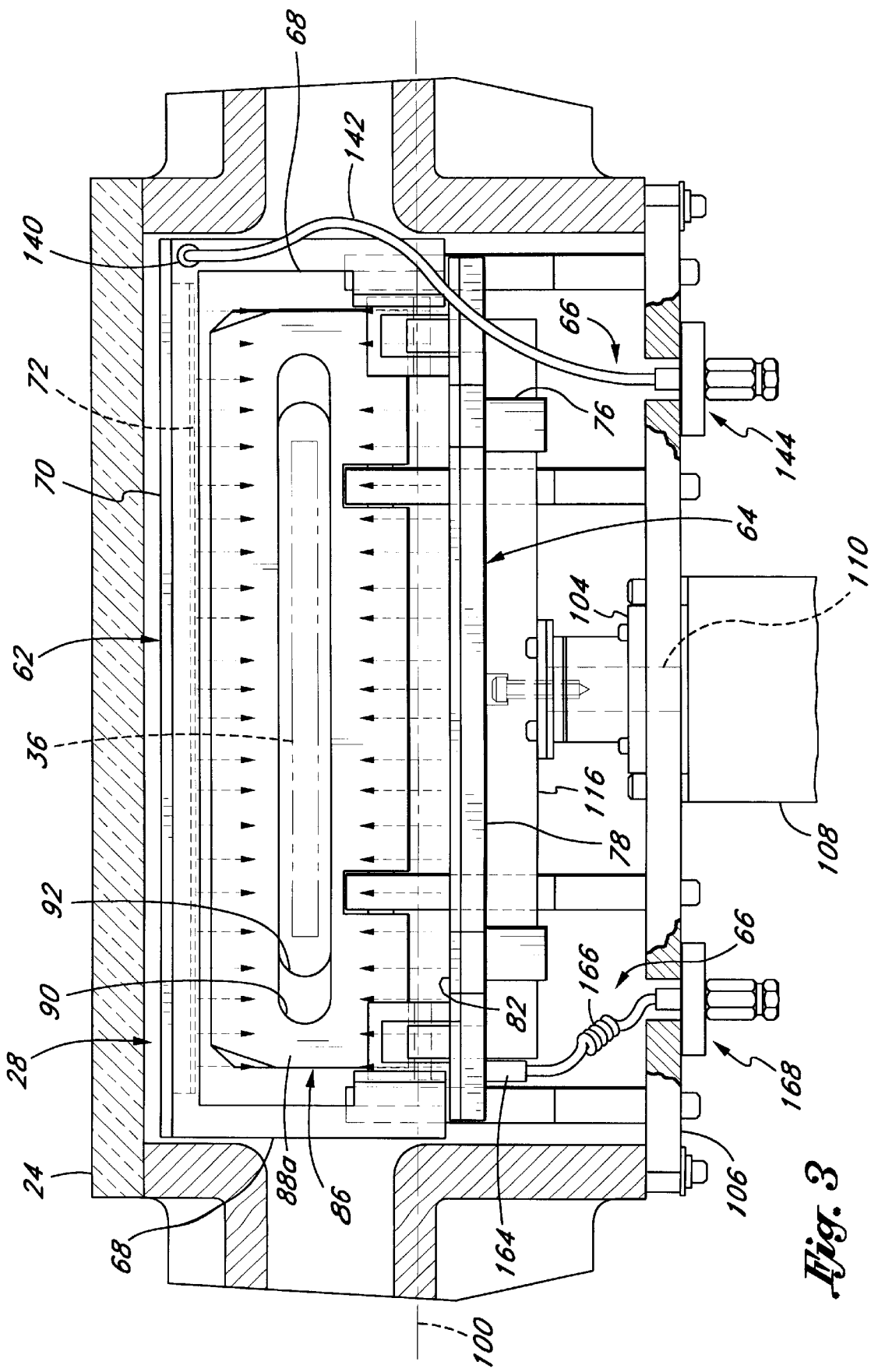
FIG. 3 is an elevational view of the gas curtain apparatus and isolation valve taken along line 3—3 of FIG. 2.
Figure 4B:
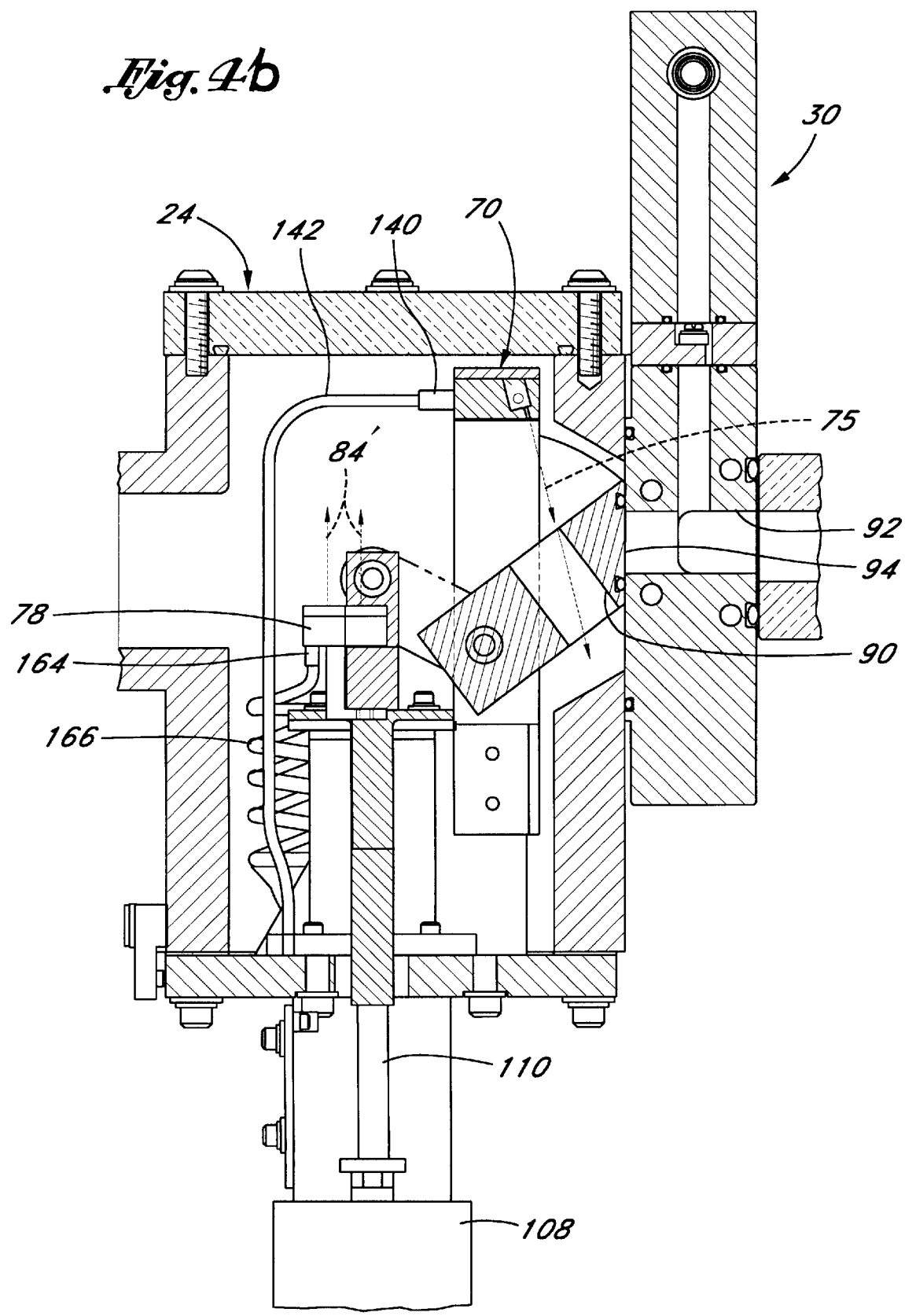
FIG. 4b is a cross-sectional view of the gas curtain apparatus adjacent a closed isolation valve.
Figure 13:
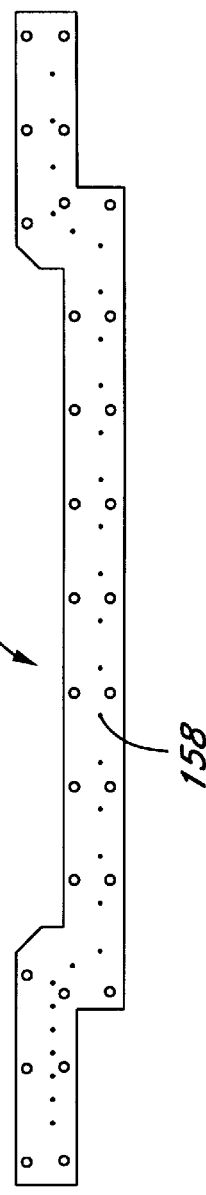
FIG. 13 is a top plan view of the lower manifold of FIG. 11.
Figure 11:
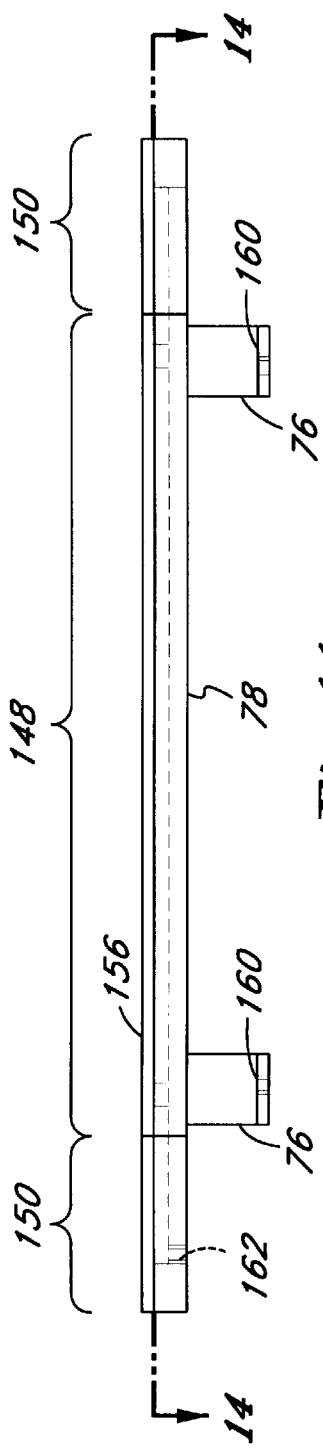
FIG. 11 is an elevational view of a lower manifold of the gas curtain apparatus.
Figure 12:
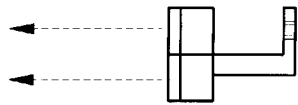
FIG. 12 is a side elevational view of the lower manifold.
Figure 14:
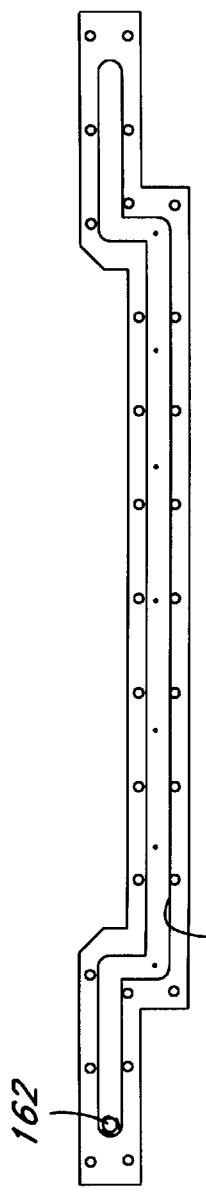
FIG. 14 is a top plan view of the lower manifold with a top cover removed taken along line 14—14 of FIG. 11.

Referring now to FIGS. 3, 4a and 4b, the general details of the gas curtain apparatus 28 will be described. The gas curtain apparatus 28 generally comprises an upper manifold 62 and a lower manifold 64 supplied by gas through a plurality of flexible hoses 66. The upper manifold 62 is generally formed in a bridge shape with a pair of outer legs 68 and an upper cross piece 70, the upper cross piece defining a horizontal chamber 72 within. Apertures 74 (FIG. 7) in the lower surface of the horizontal cross piece 70 provide a downward gas flow surrounding the isolation valve 26, as indicated at 75 in FIG. 4a. Likewise, the lower manifold 64 comprises a pair of support legs 76 and a hollow horizontal cross piece 78. A plurality of apertures 80 (FIG. 13) formed vertically through a top plate 82 attached to the horizontal cross piece 78 provide an upward gas flow 84 adjacent the isolation valve 26, as seen in FIG. 4a. The specific structural features of the upper and lower manifolds 62 and 64 will be described below with respect to FIGS. 6–14.

Isolation Valve

With reference to FIGS. 3 and 4a, the isolation valve 26 includes a generally rectangular laterally elongate body 86 with parallel opposed planar surfaces 88a, 88b and a laterally elongated slot 90 extending through the body between the opposed planar surfaces. As seen in FIG. 3, the elongated slot 90 has a lateral width longer than a horizontal delivery port 92 formed in the gas injector 30 and leading from the handling chamber 24 to the reaction chamber 32. For relative size comparison with these two apertures, the approximate outline of the Bernoulli wand 36 is illustrated in FIG. 3.

The isolation valve body 86 further includes an angled sealing surface 94 having a generally oval-shaped O-ring 96 secured in a groove and projecting slightly therefrom. The O-ring 96 provides a gas-tight seal against a wall 98 of the gas injector 30 facing into the handling chamber 24. In operation, the isolation valve body 86 pivots about an axis 100 fixed with respect to the handling chamber 24. In an open position, as seen in FIG. 4a, the body 86 is vertical so that the slot 90 extends horizontally. One of the robot arms 40a is seen extended horizontally through the slot 90 in this position of the valve body 86. In a closed position, the body 86 pivots about the axis 100 in the clockwise direction as viewed in FIG. 4a to the position shown in FIG. 4b. The angled sealing surface 94 is thus juxtaposed against the vertical wall 98, and the O-ring 96 surrounds the horizontal delivery port 92 to close the handling chamber 24 from the reaction chamber 32.

The handling chamber 24 includes an opening 102 in a bottom surface adjacent the delivery port 92 in which the isolation valve 26 is mounted. The isolation valve 26 includes a mounting plate 104 which is bolted or otherwise attached to the bottom wall 106 of the handling chamber to hermetically seal the opening 102 and support the various components of the isolation valve. A pneumatic actuator 108 mounts below the handling chamber 24, and an extensible rod 110 of the actuator 108 extends upwardly therefrom through an opening formed in the mounting plate 104. A bellows seal (not shown) or other such expedient concentrically disposed about the rod 110 hermetically seals the opening 102 through which the rod extends. The bellows seal typically has a lower mounting flange sealingly attached to the upper surface of the mounting plate 104 about the opening 102, and an upper portion of the seal is attached to the upper end of the actuator rod 110 which is connected to one end of a lever arm 112 at a pivot pin 114. The opposite end of the lever arm 112 is rigidly connected to the valve body 86, so that up and down movement of the rod 110 causes the valve body to rotate by virtue of the lever arm coupling. FIG. 4a shows the isolation valve 26 in an open position with the extension rod 110 retracted, while FIG. 4b illustrates the isolation valve closed over the port 92 through the gas injector 30 with the rod extended.

Gas Flow in Handling Chamber

FIG. 4a illustrates the downwardly directed gas flow 75 from the upper manifold 62 passing between the isolation valve 26 and the gas injector port 92. Alternatively, FIG. 4b illustrates the downward gas flow 75 from the upper manifold 70 extending through the elongated slot 90 of the isolation valve body 86 when the isolation valve 26 is in a closed position.

The lower manifold 64 is rigidly attached to a bracket 116 (FIG. 3) connected to the upper end of the bellows assembly. The lower manifold thus moves up and down with the extension rod 110. In the isolation valve 26 open position, the upward gas flow from the lower manifold 64 provides a gas curtain 84 below the pivot axis 100 of the isolation valve. In the isolation valve 26 closed position, the upward gas flow from the lower manifold 64 provides a gas curtain 84' which is initiated at approximately at the same height as the pivot axis 100 of the isolation valve. In both cases, the lower manifold 64 directs gas upwardly in a flow 84 or 84' on the opposite side of the isolation valve 26 from the downward flow 75. The cross flow of the two gas curtains 75, 84 (84') substantially intercepts any fugitive or unwanted gas existing in the handling chamber 24 before passing through the gas injector port 92, which gas is then exhausted toward the input/output chambers, as described below.

Figure 5:
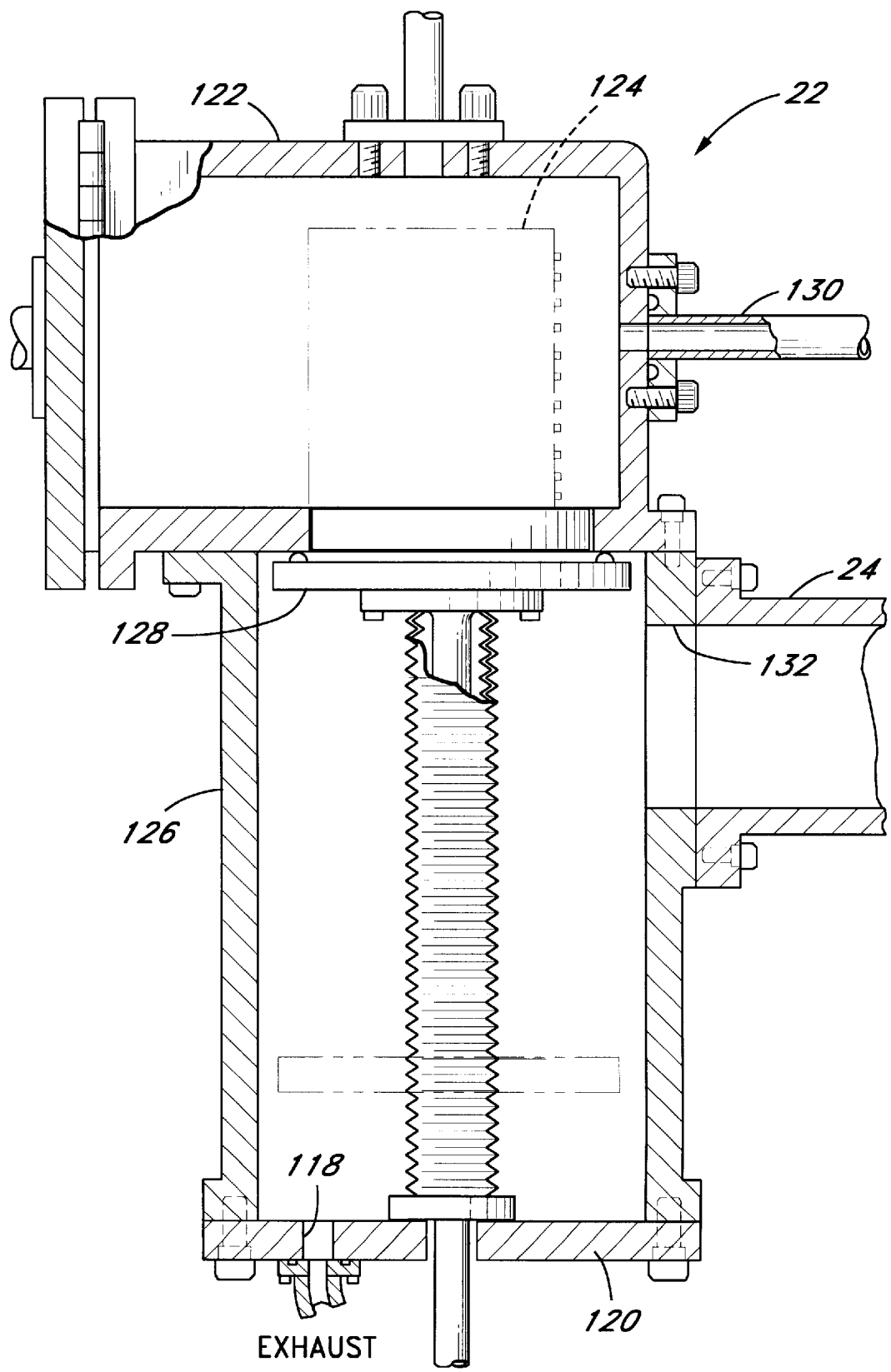
FIG. 5 is a cross-sectional view through a wafer loading/unloading chamber and elevator mechanism, taken along line 5—5 of FIG. 2.

Referring to FIGS. 5, each input/output chamber 22 comprises an upper chamber 122 for introduction of wafer magazines 124, and a lower chamber 126 having an elevator platform 128 reciprocable therein. As described in U.S. Pat. No. 5,156,521, hereby expressly incorporated by reference, the upper and lower chambers 122, 126 and platform 128, along with a purge inlet 130, prevent contamination of the handling chamber 24 and reaction chamber 32 from outside particulates. Each input/output chamber 22 includes one or more exhaust apertures 118 formed through a lower wall 120 in connection with a pressure balanced exhaust system. A continuously open feed port 132 communicates between the lower chamber 126 and handling chamber 24. The gases generated by the gas curtains 75, 84 are continually vented away from the gas injector port 92 through the feed port 132 and out of the chamber 126 through the exhaust apertures 118. Thus, there is a perpetual flow migration from the region of the gas curtain apparatus 28 away from the delivery port 92, and any particulates, moisture, or fugitive gases which are intercepted or swept out by the gas curtains are carried through the handling chamber 24 and out the exhaust apertures. This further helps prevent introduction of such unwanted matter through the gas injector port 92. There are adequate back pressure regulators (not shown) mounted in parallel in the exhaust line from the input/output chambers 22 to control pressure within the handling chamber 24 and ensure the continual venting of gases away from the reaction chamber 32.

Gas Curtain Manifolds

FIGS. 6–10 illustrate the upper manifold 62 in detail which, as mentioned above, comprises the two side legs 68 and the horizontal cross piece 70. The horizontal cross piece 70 has an inner chamber 72 formed therein covered by a plate 134. The plate 134 is suitably fastened to the horizontal cross piece 70 using fasteners, for example. The chamber 72 extends substantially along the lateral length of the horizontal cross piece 70 and includes a plurality of angled apertures 74 extending downward through a lower wall thereof. The particular angle of the apertures 74 is shown in the detailed view of FIG. 10. Lateral bores 136 formed in either lateral side of the cross piece 70 when machining the chamber 72 are desirably plugged. A third bore 138 formed in one side of the upper cross piece 70 communicates with one of the lateral bores 136. A mounting bracket 146 is provided on each of the upper manifold legs 68 to rigidly fix the upper manifold 62 with respect to the chamber 24.

With reference to FIGS. 3, 4a and 4b, a fitting 140 mounts within the bore 138 and receives a flexible gas delivery hose 142. The hose 142 enters the handling chamber 24 through a sealed mount 144 and extends upward to one side of the gas curtain 28 and isolation valve apparatus 26. Gas enters the chamber 72 at the end of the bore 138 and is distributed the length of the cross piece 70 to be evenly dispersed through the apertures 74. The angle of the apertures 74 creates the angled downward gas flow 75 shown in FIGS. 4a and 4b.

FIGS. 11–14 illustrate the components of the lower manifold 64 which, as mentioned before, comprises the two support legs 76 and the irregular shaped horizontal cross piece 78. The cross piece 78 includes a central portion 148 and a pair of outward portions 150, the outward portions being horizontally stepped in the longitudinal direction toward the reaction chamber 32 with respect to the central portion. As seen best in FIG. 14, an inner chamber 152 extends substantially the length of the stepped cross piece 78. An apertured plate 156 is provided over the chamber 154 suitably fastened thereto using fasteners, for example. A plurality of small apertures 158 are provided in the cover which allow gas to escape from the chamber 152 directly upward. This gas flow 84 is shown best in FIGS. 4a and 4b. The lower manifold 64 includes a mounting bracket 160 extending horizontally from each of the support legs 76 which attaches to the aforementioned isolation valve actuating mechanism. A bore 162 formed from an underside of the cross piece 78 communicates with the chamber 152.

With reference to FIGS. 3, 4a and 4b, a fitting 164 mounts within the bore 162 and receives a flexible gas delivery hose 166. The hose 166 enters the handling chamber 24 through a sealed mount 168 and extends upward to the underside of the cross piece 78 one on an opposite side of the isolation valve apparatus 26 from the flexible hose 142. Gas enters the chamber 152 at the bore 162 and is distributed the length of the cross piece 78 to be evenly dispersed through the apertures 158. The apertures 158 create the upward gas flow 84 shown in FIGS. 4a and 4b.

Alternative Gas Curtain Apparatus

Figure 15:
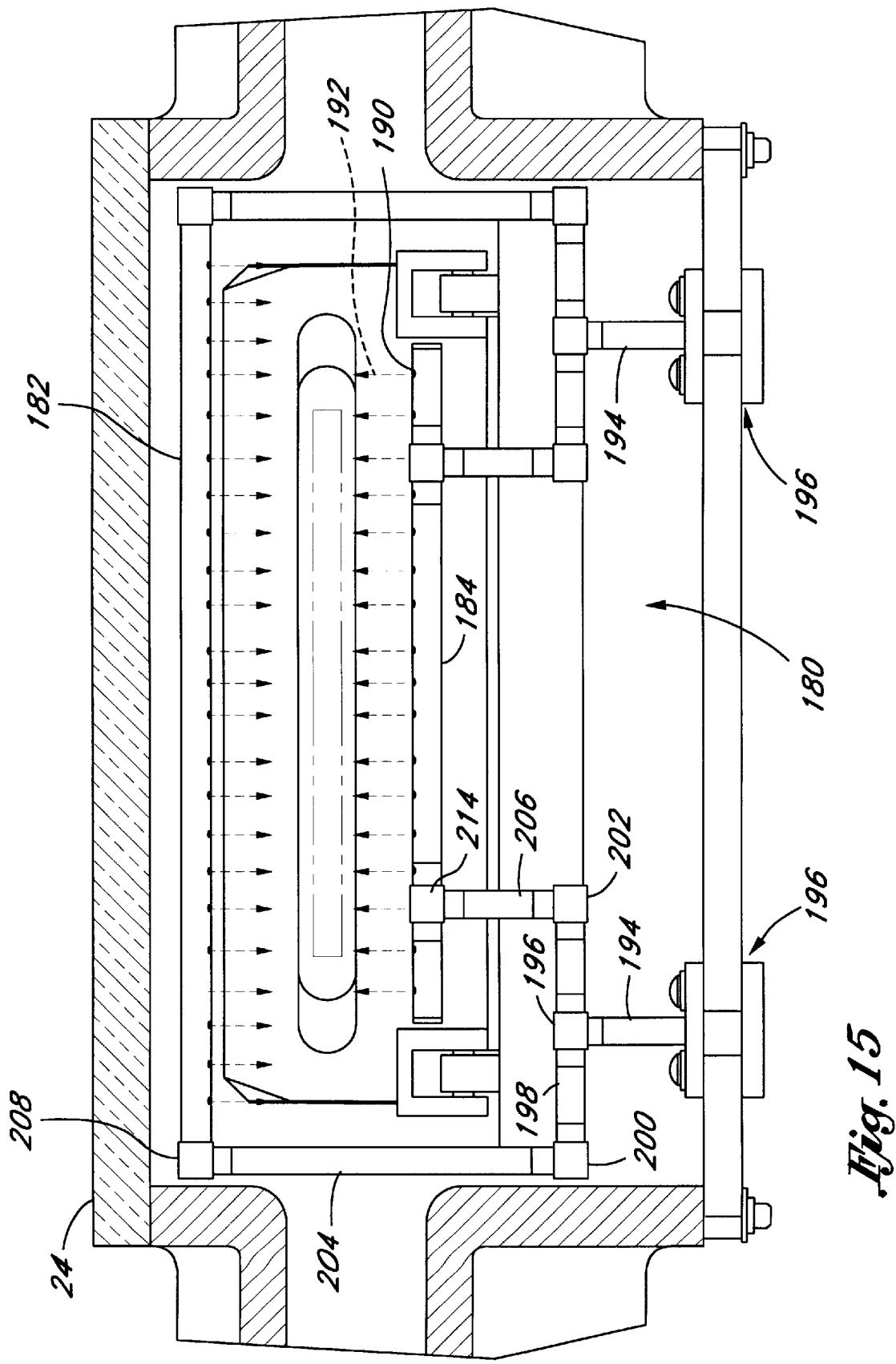
FIG. 15 is an elevational view of an alternative gas curtain apparatus and isolation valve taken along line 3—3 of FIG. 2.
Figure 16:
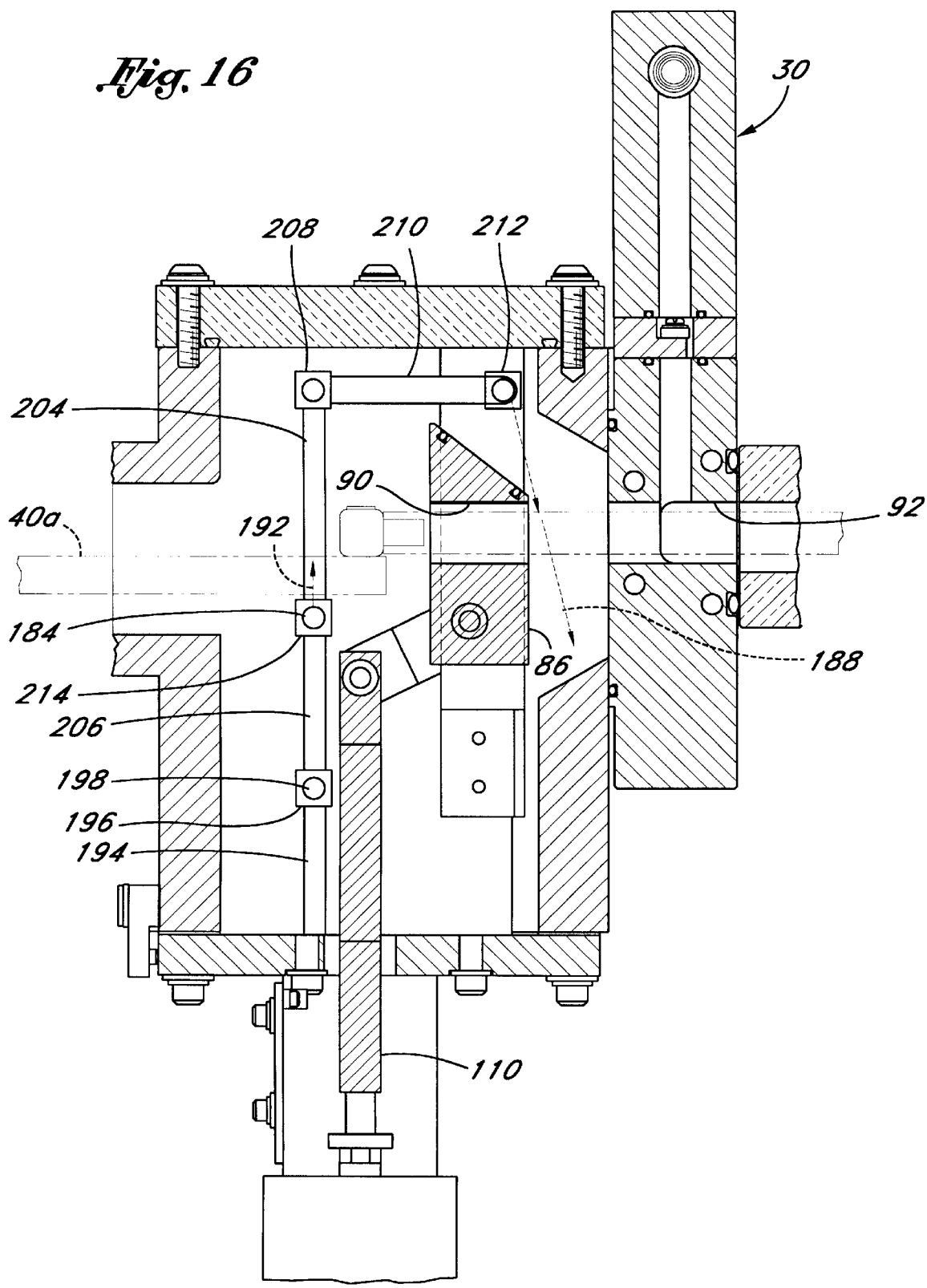
FIG. 16 is a cross-sectional view taken along line 4—4 of FIG. 2 of the alternative gas curtain apparatus of FIG. 15 adjacent an open isolation valve leading to a reaction chamber delivery port.

FIGS. 15 and 16 illustrate a further embodiment 180 of a gas curtain apparatus 28 which can be substituted for the gas manifolds 62, 64 described above. In this embodiment, a plurality of rigid pipes delivers the gas from a source exterior to the handling chamber 24 to the region surrounding the isolation valve 26. In this regard, an upper cross-pipe 182 includes a plurality of lower apertures 184 which deliver a downward curtain-like flow 188, and a lower cross-pipe 184 includes a plurality of upper apertures 190 which deliver an upward curtain-like flow 192. The piping system 180 is preferably made of stainless steel, but may also be made from other compatible materials.

The flows 188 and 192 are analogous to the flows 75 and 84 in the first embodiment. Specifically, the downward flow 188 is directed between the isolation valve 26 and the gas injector port 92 when the valve is open, and is directed through the elongated slot 90 of the isolation valve body 86 when the valve is in a closed position. In a divergence from the previous embodiment, the lower gas curtain flow is directed upward from a fixed location, rather than being coupled with the reciprocating extension rod 110.

The piping system 180 includes two parallel lower input conduits 194 entering the handling chamber 24 at sealed fittings 196. Each input conduit 194 diverges laterally at T-junctions 196 into an inwardly directed conduit 196 and an outwardly directed conduit 198. The conduits 198 connect with 90° joints 200 leading to vertical sections 204 attached to second 90° joints 208. As seen in FIG. 16, the joints 200 provide transitions to horizontal sections 210 leading to fittings 212. The fittings 212 support the upper cross-pipe 182 and provide gas inlets from the horizontal section 210 into the interior of the pipe. The conduits 196 connect with joints 202 leading to vertical sections 206 attached to fittings 214. The fittings 214 support the lower cross-pipe 184 and provide gas inlets from the vertical section 206 into the interior of the pipe.

Valve System

A valve system for the gas curtain apparatus 28, pick-up wand 36 and load locks 22 (as numbered in FIGS. 1–2) is schematically depicted in FIG. 18, which comprises subfigures 18A and 18B on separate pages. The dotted box 230 encompasses a series of flow control valves whose operational status determines the type and level of gas flowing through the gas curtain apparatus 28 and pick-up wand 36, and the level of gas flowing to the purge system of the load locks 22. The box 230 may be generally termed a purge panel, as symbols representing each valve and its operational status may be visually displayed on a control panel. Alternatively, selected valves in the purge panel 230 may be computer-controlled and the operational status displayed visually and/or obtained interactively on a monitor.

Figure 18B:
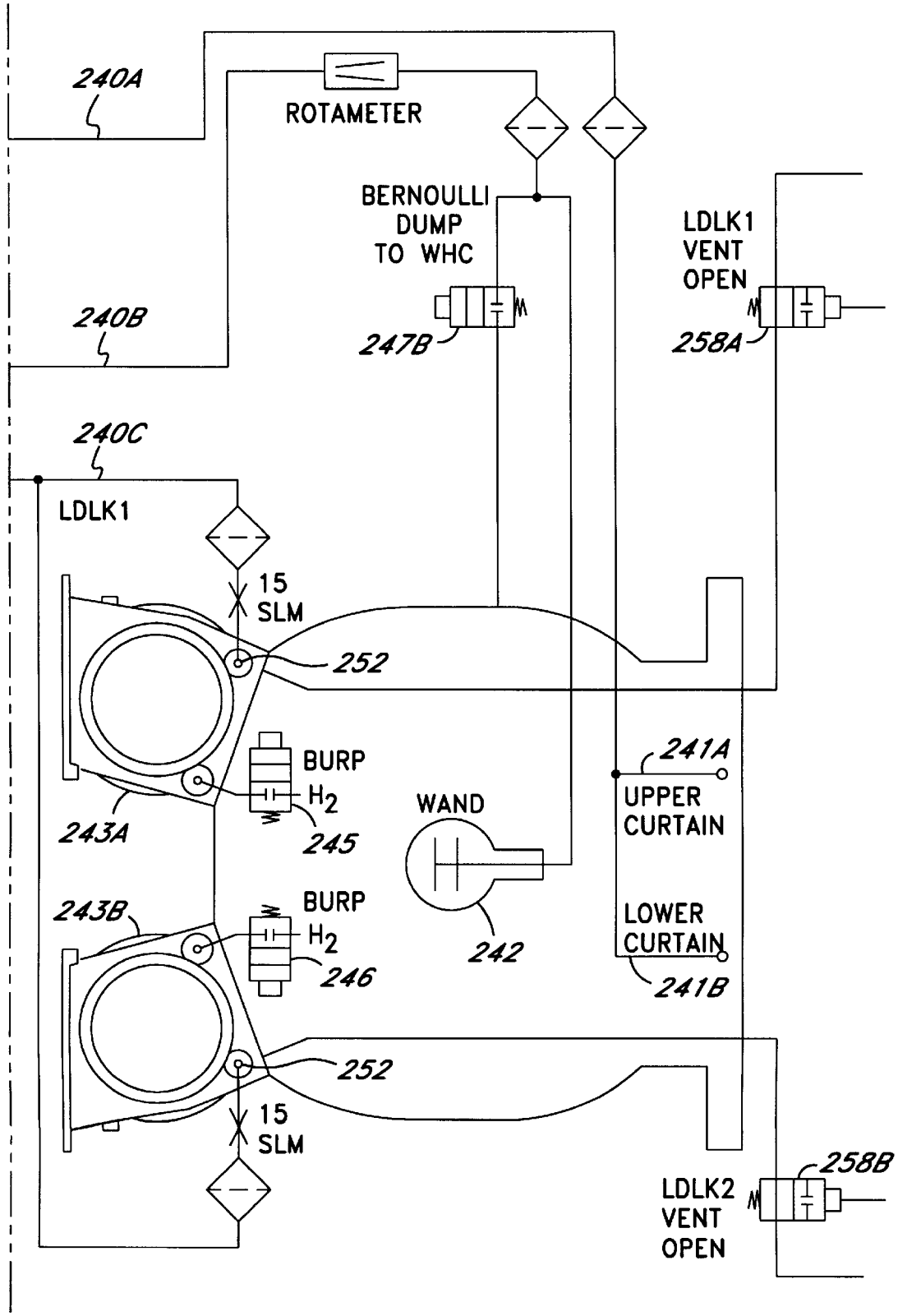

A source of nitrogen ($N_2$) and a source of hydrogen ($H_2$) are shown outside the purge panel 230. For the presently illustrated embodiment, the gasses are each supplied at 80 psig, although other pressures may be suitable. The $N_2$ from the source passes along a conduit 232 through an entry valve 234A and filter 236A before connecting with three parallel flow legs 238A, 238B and 238C. The $H_2$ from the source passes along a conduit through an entry valve 234B and filter 236B before connecting with the first flow leg 238A (and eventually to second flow leg 238B, as will be seen). An output conduit 240A from first flow leg 238A leads to upper and lower gas curtains 241A, 241B, seen in FIG. 18B. An output conduit 240B from second flow leg 238B leads to the Bernoulli wand 242. An output conduit 240C from third flow leg 238C leads to both load locks 243A, 243B.

A bypass leg 238D extends between two points in the third flow leg 238C on either side of a load lock pressure regulator 250. A pneumatically-actuated load lock high flow control valve 248 and a flow restrictor 249 are positioned in the bypass leg 238D. Normally, $N_2$ passes through the pressure regulator 250 which limits the pressure of $N_2$ in output conduit 240C to 15 psig. This pressure enables the flow restrictors adjacent the load locks 243 in FIG. 18B to meter the $N_2$ flow to 15 slm. When the load lock high flow control valve 248 is opened, $N_2$ at 80 psig in leg 238D is allowed to bypass the pressure regulator 250. The flow restrictor 249 reduces the flow (pressure) of the $N_2$ to a level which, in conjunction with the flow restrictors shown adjacent the load locks 243 in FIG. 18B, meters the flow to approximately 25 slm to each load lock 243. The high flow control valve 248 is actuated by signals sent from a controller 251.

$H_2$ "burp" valves 245, 246 (FIG. 18B) for each load lock 243 are provided to periodically sample the atmosphere within the load locks for excess $H_2$ concentration. The "burp" valves 245, 246 expose an $H_2$ detector to the sample of gas to determine the $H_2$ concentration. The specifics of the $H_2$ detector are known in the art and will not be detailed except to mention that both $H_2$ and $O_2$ must be present for the detector to function, and thus the detector must be positioned outside the load locks whose atmospheres contain no $O_2$. Each load lock 243A, 243B additionally has an exhaust vent valve 258A, 258B associated therewith.

Pneumatically-actuated valves 261A and 261B are located in the second flow leg 238B and are controlled by a single electrically-actuated pneumatic switch 265 via a common gas line 265A. Pneumatically-actuated valves 262A, 262B, and 262C are located in the first flow leg 238A and are likewise controlled by a single electrically-actuated pneumatic switch 264 via a common gas line 264A. Each of the switches is supplied with a pneumatic gas from a source (not shown).

The schematic representation of each of the pneumatically-actuated valves includes two halves, a primary half, as seen connected to the flow legs in FIG. 18A, represents the normal or unactuated condition, whereas a secondary half represents the actuated condition. Thus, for instance, left valve 262A shows an open flow line in the bottom or primary half, and a closed flow line in the top or secondary half. When pneumatic pressure is applied via common line 264A, the valve 262A closes. The pneumatic gas used may be $N_2$ or clean, dry air. The mechanical details of the valves 261, 262 and switches 264, 265 are well known by those of skill in the art and will not be described in great detail. Valves suitable for use in the present system may be obtained from Qualiflow, based in France. Furthermore, other details such as the electrical connections are not shown.

Looking at the first flow leg 238A, left valve 262A functions as an ON/OFF for the $N_2$ flow. The middle valve 262B has a $N_2$ input from the left valve 262A, an $H_2$ input from the filter 236B, an output leading to right valve 262C, and also an output to a valve 261B located in the second flow leg 238B. The right valve 262C has two selectable output lines 263A, 263B which include orifice-type flow restrictors whose outputs combine in line 240A. One flow restrictor is calibrated to pass 5 slm of $N_2$ while the other is calibrated to pass 15 slm of $N_2$. The 5 slm flow restrictor is selected for $H_2$ flow, while both the 5 and 15 slm flow restrictors are selected for $N_2$ flow, the end result being a flow of 20 slm of either gas (because of the different gas viscosities, and because the restrictors are calibrated based on $N_2$ flow, the orifices are differently sized to produce equal flow). Of course, the flow rate depends on the input pressure, which is regulated to 30 psig in this embodiment.

In the second flow leg 238B, left valve 261A functions as an ON/OFF for the $N_2$ flow. The middle valve 261B has a $N_2$ input from the left valve 261A, an $H_2$ input from the valve 262B, and an output leading to a Bernoulli wand ON/OFF valve 247A and the output conduit 240B.

In an important aspect of the valve system, all three valves 262A, 262B, and 262C which determine the type of gas flow to the gas curtains 241A,B are controlled by the common switch 264. On a signal from the controller 251, the switch 264 either permits or prevents pneumatic gas to flow into the common line 264A. Pressurization of the line 264A actuates each of the valves 262A, 262B, and 262C which are normally in the positions shown in FIG. 18A. In a similar manner, the two valves 261A and 261B which determine the type of gas flow to the Bernoulli wand 242 are controlled by the common switch 265. On a signal from the controller 251, the switch 265 either permits or prevents pneumatic gas to flow into the common line 265A. Pressurization of the line 265A actuates both valves 261A and 261B which are normally in the positions shown in FIG. 18A. The significance of the dual common valve controls will be more fully explained below in the description of the operation of the system. Indicators 266 are provided to sense pressurization of the lines 264A and 265A, and thus $H_2$ flow to the chambers. Such indicators may take many forms, a simple pop-up type piston shown having a red indicator end visible by an operator of the system when $H_2$ flows.

When the wand 242 is not in use, or when a wafer is to be dropped from the wand, the wand ON/OFF valve 247A shuts off the positive flow of gas through conduit 240B. Because of the small sized orifices in the lower surface of the wand 242, the pressure within the conduit 240B would only gradually decrease without the provision of a dump valve 247B. After the flow to the wand 242 is shut off, the dump valve 247B opens to rapidly release the pressure within the conduit 240B, thus releasing the wafer from under the wand. This configuration is needed as a very low flow of gas from under the wand 242 is needed to maintain lift, and the residual flow from simply shutting off the positive supply of gas would delay release of the wafer. In one particular wand embodiment, a flow of about 30–40 slm is required to initially pick up a wafer, but a residual flow of only 2–3 slm will maintain lift for a wafer. Thus, the dump valve 247B is needed to quickly drop a wafer.

Operation

The valve system operates in three modes. In a first mode, $N_2$ flows through both the gas curtains 241A, 241B and Bernoulli wand 242. In a second mode, $H_2$ flows through both the gas curtains 241A, 241B and Bernoulli wand 242. In a third mode $N_2$ flows through the gas curtains 241A, 241B, and $H_2$ flows through the Bernoulli wand 242.

When $N_2$ gas is desired for both the gas curtains 241A, 241B and Bernoulli wand 242, both switches 264 and 265 are closed to prevent pneumatic gas from flowing into respective lines 264A and 265A. This allows valves 262A and 262B to flow $N_2$ to right valve 262C, which channels the $N_2$ through both output lines 263A and 263B to gas curtains 241A, 241B. Likewise, valves 261A and 261B are configured so that $N_2$ flows through to output line 240B, and from there to Bernoulli wand 242. Although $H_2$ flows through valve 262B to middle valve 261B in second flow leg 238B, the $H_2$ flow stops there, as indicated schematically by the discontinuous flow path in the bottom half of the valve 261B.

If $H_2$ flow is desired through both the gas curtains 241A, 241B and Bernoulli wand 242, signals are provided by controller 251 to switches 264 and 265 to alter the flows through the first and second flow legs 238A, 238B. The switches 264 and 265 then open to permit pneumatic gas to flow into respective lines 264A and 265A. Valve 262A closes to prevent $N_2$ from continuing through first leg 238A, and middle valve 262B switches to flow $H_2$ to right valve 262C. Right valve 262C channels the $H_2$ flow through output line 263B (calibrated for $H_2$ flow). $H_2$ continues to flow through valve 262B to middle valve 261B in second flow leg 238B. Valve 261A closes to prevent $N_2$ from continuing through second leg 238B, and middle valve 261B opens to flow $H_2$ through valve 247A (if open) and conduit 240B to Bernoulli wand 242.

In the third mode, $N_2$ flows to the gas curtains 241A,B only, and $H_2$ flows to the Bernoulli wand 242. In this situation, the second valve 262B in flow leg 238A is in the position illustrated, with $N_2$ flowing therethrough to third valve 262C, and with $H_2$ flowing to second valve 261B in second flow leg 238B. Switch 265 opens on a signal from controller 251 to permit pneumatic gas to flow into line 265A. Consequently, left valve 261A closes to prevent $N_2$ from continuing through second leg 238B, and middle valve 261B is actuated opposite the position shown, to flow $H_2$ to Bernoulli wand ON/OFF valve 247A. As long as valve 247A is open, $H_2$ then flows to wand 242.

Although the system is described in the context of flowing either $N_2$ or $H_2$ and is calibrated for those gasses, other suitable gasses may be substituted as desired, the present valve system more generally being useful for switching flow through either the gas curtains 241A, 241B or Bernoulli wand 242 from one particular gas to another.

In the case of $H_2$, the present system provides a "fail safe" design to prevent excessive levels of $H_2$ from building up in the chambers. When the power fails, or when the supply of pneumatic gas to switches 264 and 265 is interrupted, the valve system will default to flowing $N_2$. That is, the valves 261 and 262, which control the presence of $H_2$ in the chambers, are configured to flow $N_2$ in their normal or unactuated states. The valves include spring-loaded pistons which are biased into this normal, safe position, and only flow $H_2$ when pneumatic pressure is applied. Thus, upon a power failure or interruption of gas supply, the pistons are biased into positions permitting $N_2$ to flow, and preventing $H_2$ flow. The valves could conceivably be actuated independently with each being configured to default to $N_2$ flow in the event of a system failure, but the common connections simplify the control logic, and reduces the necessary electronic and pneumatic components.

Preferably, the gas curtains operate continuously during wafer processing. The processing can be segmented into discrete time intervals. With reference to the nomenclature of FIGS. 1–17, initially, there are no wafers in the handling chamber 24 or reaction chambers 32. The reaction chamber 32 is first brought to a pre-heated temperature. During this time, the isolation valve 26 remains closed. A gas is supplied to the gas curtain apparatus 28 as well as to the Bernoulli wand 36. The wand 36 picks up a wafer 37 from the magazine 124 through the feed port 132. The isolation valve 26 opens and the wand 36 extends through the slot 90 and delivery port 92 to deposit the wafer 37 in the reaction chamber 32. The wand 36 withdraws and the valve 26 closes enabling processing of the wafer 37. Ultimately, the reaction completes, the valve 26 opens, and the wand 36 extends to remove the wafer 37 from the reaction chamber 32 and replace it in a magazine 124, or in another chamber for further processing. During this entire cycle, gas continuously flows through the gas curtain apparatus 28 and the exhaust 118 operates to create a pressure gradient in the handling chamber 24 away from the delivery port 92. The sweeping action of the gas from the handling chamber toward the load lock chambers 22 effectively removes any gasses, moisture, or particulates that may have entered the system through the exterior loadlock door.

The particular type of gas utilized in both the gas curtain 28 and the Bernoulli wand 36 may vary. It has been discovered, however, that hydrogen ($H_2$) is desirable because of its ability to sweep water molecules from the handling chamber into the loadlock chamber.

Hydrogen gas appears to be slightly better at attracting water than nitrogen gas. This is believed to be because of two phenomena. First, when measured at standard temperature and pressure, hydrogen gas is slightly more soluble in water than is nitrogen gas (the molar fraction solubilities of hydrogen and nitrogen gases in water are $1.411 \times 10^{-5}$ and $1.183 \times 10^{-5}$, respectively). Because hydrogen has a higher solubility in water, one would predict that the attraction between hydrogen gas and water is greater than that between nitrogen gas and water. Intermolecular attractions of this kind are reciprocal in nature and hydrogen gas dissolves better in water than does nitrogen gas. Therefore water should "dissolve" better in hydrogen gas than nitrogen gas, and hydrogen gas would tend to pick up more surrounding water than nitrogen gas would, because of the stronger intermolecular attraction between water and hydrogen.

A second explanation why hydrogen gas attracts water better than nitrogen gas has to do with molecular structure. The molecular orbitals of water that contain non-bonding electrons are centered about the oxygen atom and are oriented in space in the direction opposite that of the two hydrogen atoms. These electron rich orbitals are thus oriented in a way that enables them to interact with orbitals of other atoms or molecules that may be empty or relatively electron deficient. Such interactions are driven by the water molecule's desire to achieve a lower energy state. In hydrogen gas (dihydrogen), most of the electron density is between the two hydrogen atoms; very little is on the side 180° from the bond axis. This space is home to atomic and molecular orbitals, and although these orbitals are high in energy, they are empty and oriented in a way that they may interact with the electron rich orbitals of the water, allowing the water molecule to achieve a lower energy state. The molecular structure of nitrogen gas (dinitrogen) is similar to that of hydrogen gas in that it is a linear molecule with most of its electron density between the two atoms. However, unlike hydrogen gas, nitrogen gas has orbitals containing pairs of non-bonding electrons located 180° from the bond axis on each side of the molecule. Because the nitrogen gas molecule is literally surrounded with electrons, it is not as inviting of an "electron dump" as is the hydrogen gas molecule. Nitrogen gas has empty molecular orbitals, but they are not as accessible to the water molecule as are the orbitals of the hydrogen molecule.

Because of the permanent dipole observed for water molecules, however, nitrogen may enjoy a slight advantage when accounting for a dipole-induced dipole interaction. This would help explain why the strengths of attraction of nitrogen gas and hydrogen gas with water are not as great as what might be estimated based strictly upon the solubility or molecular orbital explanation. Because the hydrogen gas molecule has only two electrons, both tightly held and involved in bonding, it is not very polarizable and not a good candidate for an induced dipole. The nitrogen gas molecule, on the other hand, has some loosely held electrons and it is fairly polarizable, making it a good candidate for an induced dipole. Thus, one would predict that water and nitrogen gas would have some dipole-induced dipole interactions.

Although hydrogen is found to be preferred with regard to its attraction to water molecules, it is somewhat more expensive than other gases, such as nitrogen which is typically used for such purging processes. In addition, hydrogen is flammable and creates a potential hazard if allowed to mix with oxygen in a closed atmosphere such as the reaction chamber. Therefore, to reduce the danger of an explosion, many customers prefer the use of nitrogen as much as possible. The present invention provides for a number of different gas flow sequences utilizing all hydrogen, or a combination of hydrogen and nitrogen. These are seen in FIG. 17.

The events during a typical processing sequence are indicated along the top row of FIG. 17. These events include the pick up of the wafer by the Bernoulli wand from the magazine in the loadlock, transporting the wafer from the loadlock across the handling chamber to a gate valve at the entrance to a reaction chamber, opening the gate valve, loading the wafer into the reaction chamber and onto the susceptor for processing, retracting the Bernoulli wand and closing the gate valve, processing the wafer within the reactor, reopening the gate valve and removing the wafer from the reaction chamber, closing the gate valve, and preparing the reaction chamber for subsequent processes. A number of conditioning steps may be taken during the preparation of the reaction chamber for the next wafer, such as etching the chamber and sometimes injecting a small amount of silicon-based gas into the etched chamber to deposit a thin layer of silicon on the etched surfaces of the susceptor. The time for preparing the chamber varies from between 30 seconds to two minutes.

In a first sequence, the wafer is picked up using nitrogen flowing through the Bernoulli wand, and with nitrogen also flowing through the gas curtain to be exhausted from a point closest to the loadlock chamber. At a predetermined moment after picking up the wafer, both the Bernoulli wand and the gas curtain are switched from flowing nitrogen to flowing hydrogen. The time at which the gas flows switch is determined to allow a sufficient delay after switching to hydrogen before the reaction chamber gate valve opens to avoid any nitrogen in the reaction chamber. This also helps sweep out more moisture from the gate valve region which may have migrated from the load lock in the nitrogen atmosphere. In one specific example, the Bernoulli wand and gas curtain are switched from nitrogen to hydrogen approximately eight seconds before the gate valve to the reaction chamber opens. This corresponds to the time at which the Bernoulli wand begins to rotate with the wafer toward the reaction chamber. After the wafer is loaded, and the Bernoulli wand retracts, the gate valve closes and both the Bernoulli wand and the gas curtain switch back to flowing nitrogen. This sequence maximizes the volume of nitrogen flowing through the Bernoulli wand and the gas curtain to minimize the expense and potential danger of flowing excessive amounts of hydrogen.

In a second sequence shown in FIG. 17, the Bernoulli wand is switched to hydrogen prior to picking up the wafer from the magazine. Hydrogen flows through the Bernoulli wand and through the gas curtain until the wafer is loaded, after which the wand retracts from the reaction chamber and the gate valve closes. At this point, the wand and gas curtain switch back to nitrogen which continues to flow while the wafer is unloaded and the chamber is prepared for a subsequent wafer.

The third sequence of FIG. 17 shows the Bernoulli wand and gas curtain flowing nitrogen at the time of wafer pick-up, and being switched to hydrogen approximately eight seconds before the gate valve to the reaction chamber opens (similar to sequence one). Hydrogen continues to flow through both the Bernoulli wand (when operated) and the gas curtain during the time the wafer is processed and unloaded, and the gas flows are converted to nitrogen only after the gate valve closes prior to preparation of the reaction chamber for a subsequent wafer.

Sequence four in FIG. 17 shows the Bernoulli wand gas curtain flowing hydrogen prior to picking up the wafer. Hydrogen continues to flow until the gate valve has closed after unloading the wafer that has been processed and prior to preparing the reaction chamber for a subsequent wafer.

The fifth sequence of FIG. 17 illustrates hydrogen flowing through a majority of the events except for during processing of the wafer. That is, the Bernoulli wand and gas curtain switch from hydrogen to nitrogen after the gate valve is closed and during the time the wafer is being processed, and switched back to hydrogen prior to the gate valve opening and the wafer being unloaded.

In a final sequence, shown in FIG. 17, both the Bernoulli wand and the gas curtain flow hydrogen throughout the entire cycle.

Another advantage of the present gas curtain invention is the improved cooling efficiency of the system. That is, after hot wafers are removed from the reaction chamber, they are brought into proximity of the gas curtain flows and the Bernoulli wand is instructed to halt to allow the crossing flows to contact the wafer. In this manner, the wafers wait for a period of between 30 seconds and one minute just outside the reaction chamber to allow the gas curtains to provide some cooling thereto. This short interval of cooling allows the Bernoulli wand to continue on and place the wafer within a magazine, the wafer having being cooled down to a temperature sufficiently low so as not to damage the wafer or wafer magazine.

It will be noted that the gas flow through the Bernoulli wand may be switched while the wafer is being held. Because of this, the two different gas flows must be carefully calibrated to provide the same lift force to the wafer. While the Bernoulli wand is calibrated using a nitrogen flow, hydrogen, being a less dense gas, must flow at a greater volumetric flow rate for the same lift.

The Bernoulli wand pressure/flows are seen in the chart of Table 1 below. Fine adjustments for optimum performance are done with hydrogen flowing in the Bernoulli wand. That is, the Bernoulli wand is first calibrated with nitrogen flowing, and then switched to a hydrogen flow for a final adjustment.

| BERNOULLI WAND FLOW/PRESSURE | | | |
|---|---|---|---|
| Wafer Size | H$_2$ Nominal Flow | N$_2$ Nominal Flow | Maximum PSI |
| 200 mm. | 150 slm | 50/60 slm | 70 |
| 150 mm. | 150 slm | 50 slm | 65 |
| 125 mm. | 143 slm | 50 slm | 60 |
| 100 mm. | 133 slm | 40 slm | 55 |

The pressure in the wafer handing chamber should normally run at about 1 to 18 inches of water above the ambient pressure with the reaction chamber isolation valve closed. During the time that the isolation valve is open, the pressure balance between the wafer handling chamber and reaction chamber should be about 1 to 5 inches of water. That is, the pressure in the handling chamber is slightly greater than the pressure in the reaction chamber. A precise pressure balance is maintained between the handling chamber and the reaction chamber to help ensure that no reactor exhaust gas is drawn into the reactor and into the handling chamber, and also to minimize the amount of curtain flow entering the reactor. The pressure regulators control the pressure within the loadlock and handling chambers and prevent any overpressure which might cause gasses to flow into the reaction chamber. The pressure within the reaction chamber is generally known based on the type of scrubber which is positioned in the exhaust conduit. Some scrubbers produce a vacuum, and thus a throttle valve in the reaction chamber exhaust line may be necessary to ensure the precise balancing between the handling chamber and the reaction chamber.

Although this invention has been described in terms of certain preferred embodiments, other embodiments that will be apparent to those of ordinary skill in the art are intended to be within the scope of this invention. Accordingly, the scope of the invention is intended to be defined by the claims that follow. For example, wafer handlers using a paddle pickup or other handlers, besides the one described herein, may be used with the gas curtain system. Also isolation valves at the entry to the reactor, other than the one described, may be utilized.

What is claimed is:

1. A gas curtain apparatus for a wafer processing system, the system including a handling chamber and a reaction chamber with a delivery port therebetween having an isolation valve adapted for alternately opening and closing the port, comprising:

a first series of apertures in an upper member adapted to direct gas generally downward in a first curtain on the handling chamber side of the delivery port and on the reaction chamber side of at least a portion of the isolation valve; and

15 a second series of apertures in a lower member adapted to direct gas upward in a second curtain on the handling chamber side of the deliver port.

2. The apparatus of claim 1, wherein said upper member comprises a manifold having a chamber formed within, said first series of apertures extending between said chamber and a lower surface of said manifold.

3. The apparatus of claim 1, wherein said upper member comprises a pipe having a chamber formed within, said apertures extending through a lower wall of said pipe.

4. The apparatus of claim 1, wherein said first series of apertures are directed at an angle toward said reaction chamber.

5. The apparatus of claim 1, wherein said lower member comprises a manifold having a chamber formed within, said apertures extending between said chamber and an upper surface of said manifold.

6. The apparatus of claim 1, wherein said lower member comprises a pipe having a chamber formed within, said second series of apertures extending through an upper wall of said pipe.

7. A wafer processing system, comprising:
 a load chamber adapted to receive wafers from an external source and having an exhaust;
 a handling chamber attached to and in communication with said load chamber;
 a reaction chamber attached to and in communication with said handling chamber and a delivery port provided therebetween;
 a wafer handler mounted in said handling chamber including an extension arm for transferring wafers to and from said reaction chamber through said delivery port;
 an isolation valve mounted in said handling chamber to alternately open and close the delivery port; and
 a gas curtain apparatus mounted in said handling chamber adjacent said isolation valve, said gas curtain apparatus having an upper portion positioned above the level of the delivery port for generating a first flow of gas generally downward, and a lower portion positioned below the level of the delivery port for generating a second flow of gas generally upward, both the first and second gas flows being exhausted from said load chamber exhaust when said isolation valve is closed.

8. The system of claim 7, including one or more valves for switching the gas flow for said gas curtains from a first gas to a second gas during a cycle of moving a wafer from the load chamber, through the handling chamber, into and out of the reaction chamber, and to an unload chamber.

9. The system of claim 7, wherein said wafer handler includes a Bernoulli wand through which gas is flowed to lift a wafer, and one or more valves for switching gas flow for said gas curtains and through said Bernoulli wand from a first gas to a second gas during a cycle of transferring a wafer from the load chamber, through the handling chamber, into and out of the reaction chamber, and to an unload chamber and the loading of a second wafer to start a second cycle.

10. A method of processing wafers, comprising the steps of:
 loading a wafer from an external source into a load chamber having an exhaust;
 extracting said wafer from said load chamber into a handling chamber attached to and in communication with said load chamber using a wafer handler mounted in said handling chamber;
 opening a delivery port between said handling chamber and a reaction chamber attached to and in communication with said handling chamber by actuating an isolation valve mounted in said handling chamber;
 generating an upward curtain of purge gas flow from a location below the level of said delivery port and a downward curtain of purge gas flow from a location above the level of said delivery port;
 delivering said wafer through said delivery port to said reaction chamber;
 closing said delivery port by actuating said isolation valve; and
 exhausting said upward and downward curtains of purge gas flow from said handling chamber by creating a pressure gradient in said handling chamber with said a pressure balanced exhaust system.

11. The method of claim 10, wherein the step of extracting said wafer includes flowing gas through a Bernoulli wand on end of said wafer handler to lift said wafer.

12. The method of claim 11, including using hydrogen gas through said Bernoulli wand and for said curtains when said wafers are to be moved through said handling chamber and into said reaction chamber and during the closing of said delivery port.

13. The method of claim 12, including:
 opening said delivery port after said wafer has been processed in the reaction chamber;
 removing said wafer from the reaction chamber with said Bernoulli wand and transferring it to an unload chamber;
 extracting a second wafer from said load chamber;
 switching the gas flow from hydrogen to nitrogen during at least a portion of the cycle continuing after said closing of said delivery port and said extracting of said second wafer; and
 switching the gas flow from nitrogen to hydrogen in sufficient time to ensure that substantially any nitrogen in the handling chamber has been replaced by hydrogen before said delivery port is opened to deliver said second wafer into said reaction chamber.

14. The method of claim 10, including using hydrogen gas through said Bernoulli wand and for said curtains when said wafers be moved through said handling chamber and into said reaction chamber and during the closing of said delivery port.

15. In a gas curtain apparatus for a wafer processing system including a handling chamber and a reaction chamber with a delivery port there between and having an isolation valve adapted for alternatively opening and closing of the port, a method of preventing unwanted material from entering the reaction chamber comprising:
 directing gas generally downwardly through a first series of apertures in an upper member to form a first gas curtain on the handling chamber side of the delivery port and on the reaction chamber side of at least a portion of the isolation valve; and
 directing gas upward through a second series of apertures in the lower member to form a second gas curtain on the handling chamber side of the delivery port.

16. The method of claim 15, wherein the gas directed through said first series of apertures is directed at an angle toward said reaction chamber.

17. A wafer processing system, comprising:
 a handling chamber;
 a reaction chamber attached to and in communication with said handling chamber and a delivery port provided therebetween;

an isolation valve mounted in said handling chamber to alternately open and close the delivery port;

a gas curtain apparatus mounted in said handling chamber adjacent said delivery port;

a supply of first gas;

a supply of second gas; and one or more valves located between said first gas supply and said gas curtain apparatus and between said second gas supply and said gas curtain apparatus, for switching gas flow for said gas curtains from a first gas to a second gas during a cycle of transferring a wafer from the handling chamber into the reaction chamber through the delivery port.

18. The system of claim 17, including:

a wafer handler mounted in said handling chamber having an extension arm for transferring wafers to and from said reaction chamber through said delivery port.

19. The system of claim 18, wherein said wafer handler includes a Bernoulli wand through which gas is flowed to lift a wafer, and said one or more valves meter gas flow for said Bernoulli wand as well as said gas curtains.

20. The system of claim 19, including:

a load lock chamber attached to and in communication with said handling chamber adapted to receive wafers from an external source and having an exhaust for exhausting said gas curtains from said handling chamber.

21. The system of claim 17, wherein said gas curtain apparatus comprises an upper portion positioned above the level of the delivery port for generating a first flow of gas generally downward, and a lower portion positioned below the level of the delivery port for generating a second flow of gas generally upward.

22. The system of claim 17, wherein one of said first or second gas is hydrogen.

23. The system of claim 17, wherein said one or more valves are configured to only flow said first gas to said gas curtains in the event of a power failure.

24. The system of claim 17, wherein said one or more valves are pneumatically actuated and configured to only flow said first gas to said gas curtains in the event of a loss of pneumatic pressure.

25. A wafer processing system, comprising:

a handling chamber;

a wafer handler mounted in said handling chamber for transferring wafers having an extension arm and a Bernoulli wand through which gas is flowed to lift a wafer;

a supply of first gas;

a supply of second gas; and one or more valves located between said first gas supply and said wafer handler and between said second gas supply and said wafer handler for switching gas flow for said Bernoulli wand from a first gas to a second gas.

26. The system of claim 25, including:

a gas curtain apparatus mounted in said handling chamber adjacent said delivery port.

27. The system of claim 26, wherein said gas curtain apparatus comprises an upper portion positioned above the level of the delivery port for generating a first flow of gas generally downward, and a lower portion positioned below the level of the delivery port for generating a second flow of gas generally upward.

28. The system of claim 27, wherein said one or more valves meter gas flow for said gas curtains as well as said Bernoulli wand.

29. The system of claim 25, including:

a load lock chamber attached to and in communication with said handling chamber adapted to receive wafers from an external source and having an exhaust for exhausting said gas curtains from said handling chamber.

30. The system of claim 25, wherein one of said first or second gas is hydrogen.

31. The system of claim 25, wherein said one or more valves are configured to only flow said first gas to said Bernoulli wand in the event of a power failure.

32. The system of claim 25, wherein said one or more valves are pneumatically actuated and configured to only flow said first gas to said Bernoulli wand in the event of a loss of pneumatic pressure.

33. A method of transferring wafers in a wafer processing system, comprising the steps of:

lifting a wafer into a handling chamber using a wafer handler mounted in said handling chamber;

opening a delivery port between said handling chamber and a reaction chamber attached to and in communication with said handling chamber by actuating an isolation valve mounted in said handling chamber;

generating an upward curtain of purge gas flow from a location below the level of said delivery port and a downward curtain of purge gas flow from a location above the level of said delivery port;

delivering said wafer through said delivery port to said reaction chamber;

closing said delivery port by actuating said isolation valve.

34. The method of claim 33, wherein the step of extracting said wafer includes flowing gas through a Bernoulli wand on end of said wafer handler to lift said wafer.

35. The method of claim 34, including using hydrogen gas through said Bernoulli wand and for said curtains when said wafers are to be moved through said handling chamber and into said reaction chamber and during the closing of said delivery port.

36. The method of claim 35, including:

opening said delivery port after said wafer has been processed in the reaction chamber;

removing said wafer from the reaction chamber with said Bernoulli wand and transferring it to an unload chamber;

extracting a second wafer from said load chamber;

switching the gas flow from hydrogen to nitrogen during at least a portion of the cycle continuing after said closing of said delivery port and said extracting of said second wafer; and switching the gas flow from nitrogen to hydrogen in sufficient time to ensure that substantially any nitrogen in the handling chamber has been replaced by hydrogen before said delivery port is opened to deliver said second wafer into said reaction chamber.

37. A method of transferring wafers in a wafer processing system, the system including a wafer handling chamber with a wafer handler mounted therein and a wafer processing chamber connected thereto, a delivery port and isolation valve separating the handling and processing chambers, and a gas curtain apparatus positioned in the handling chamber in the vicinity of the isolation valve, the method comprising the steps of:

flowing a first gas through the gas curtain apparatus while the isolation valve is closed;

switching the flow of gas through the gas curtain apparatus from said first gas to a second, different gas;

sweeping said first gas from the vicinity of the delivery port with said gas curtain apparatus after said step of switching, then;

opening said delivery port by actuating said isolation valve;

delivering a wafer through said delivery port to said processing chamber by extending said wafer handler through said delivery port; and closing said delivery port by actuating said isolation valve.

38. The method of claim 37, wherein the step of sweeping comprises generating an upward curtain of purge gas flow from a location below the level of said delivery port and a downward curtain of purge gas flow from a location above the level of said delivery port.

39. The method of claim 37, including the step of:

exhausting said first gas from said handling chamber and into a pressure balanced exhaust system in a direction away from said delivery port during said step of sweeping.

40. The method of claim 37, wherein the wafer handler includes a Bernoulli pickup wand, and said method includes the step of:

flowing said first gas through the Bernoulli pickup wand while the isolation valve is closed;

switching the flow of gas through the Bernoulli pickup wand from said first gas to said second gas at the same time or before said gas curtain apparatus.

* * * * *

UNITED STATES PATENT AND TRADEMARK OFFICE
CERTIFICATE OF CORRECTION

PATENT NO. : 5,997,588  
DATED : December 7, 1999  
INVENTOR(S) : Goodwin, et al.

Page 1 of 1

It is certified that error appears in the above-identified patent and that said Letters Patent is hereby corrected as shown below:

Column 18, claim 36,
Line 58, after chamber, please add:
-- loading a wafer from an external source into a load chamber having an exhaust connected therewith;
and
removing said upward and downward curtains of purge gas flow from said handling chamber by exhausting into a pressure balanced exhaust system. --

Signed and Sealed this

Fourth Day of September, 2001

*Attest:*

*Attesting Officer*

NICHOLAS P. GODICI  
*Acting Director of the United States Patent and Trademark Office*